United States Patent
Tsai et al.

[11] Patent Number: 5,880,005
[45] Date of Patent: Mar. 9, 1999

[54] METHOD FOR FORMING A TAPERED PROFILE INSULATOR SHAPE

[75] Inventors: Chia Shiung Tsai; Hun-Jan Tao, both of Hsin-chu, Taiwan

[73] Assignee: Taiwan Semiconductor Manufacturing Company, Ltd., Hsin-Chu, Taiwan

[21] Appl. No.: 956,967

[22] Filed: Oct. 23, 1997

[51] Int. Cl.⁶ .................................................. H01L 21/76
[52] U.S. Cl. .......................... 438/424; 438/691; 438/701
[58] Field of Search ...................... 438/424, 425, 438/426, 427, 435, 437, 673, 701, 756, 691

[56] References Cited

U.S. PATENT DOCUMENTS

| | | | |
|---|---|---|---|
| 4,654,120 | 3/1987 | Dougherty | 438/424 |
| 5,084,419 | 1/1992 | Sakao | 438/429 |
| 5,162,261 | 11/1992 | Fuller et al. | 438/701 |
| 5,254,214 | 10/1993 | Hijikata et al. | 156/643 |
| 5,595,926 | 1/1997 | Tseng | 437/52 |
| 5,622,596 | 4/1997 | Armacost et al. | 438/702 |
| 5,629,237 | 5/1997 | Wang et al. | 438/701 |
| 5,721,173 | 2/1998 | Yano et al. | 438/424 |

*Primary Examiner*—Olik Chaudhuri
*Assistant Examiner*—Anh D. Mai
*Attorney, Agent, or Firm*—George O. Saile; Stephen B. Ackerman

[57] ABSTRACT

A method for creating a tapered profile insulator shape, on an underlying silicon nitride layer, using a photoresist shape as a mask, has been developed. A two step dry etching procedure is used, featuring a first dry etching phase, using an etching chemistry comprised of argon, $CHF_3$ and $CF_4$, resulting in a tapered profile insulator shape, underlying the photoresist shape. A second dry etching phase, exhibiting high etch rate selectivity between insulator layer and underlying silicon nitride, via use of an etching chemistry comprised of argon, $CHF_3$, $CH_2F_2$, and $CH_3F$, is used to remove residual insulator layer from the underlying silicon nitride layer, without significant attack of the underlying silicon nitride layer.

18 Claims, 3 Drawing Sheets

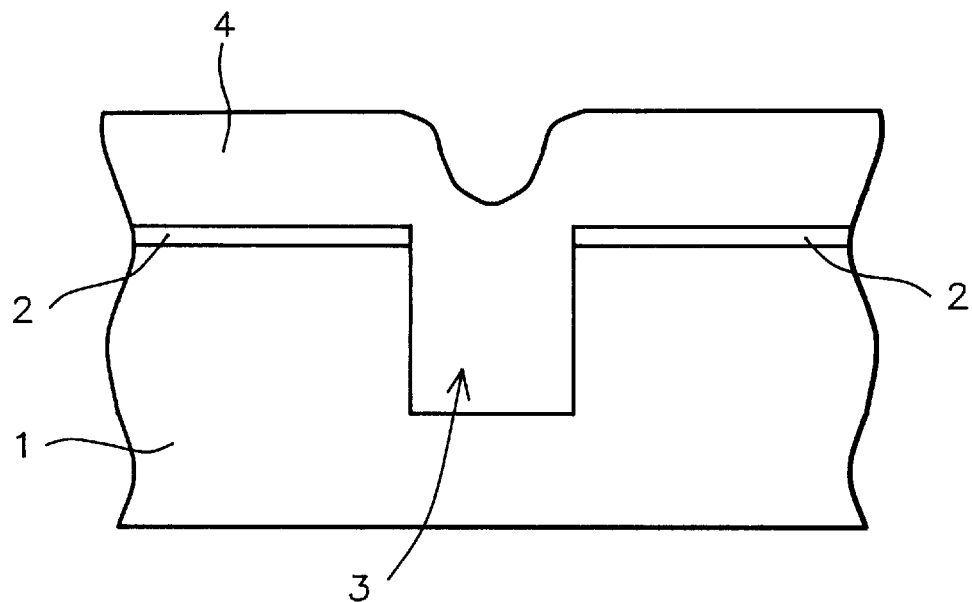
FIG. 1
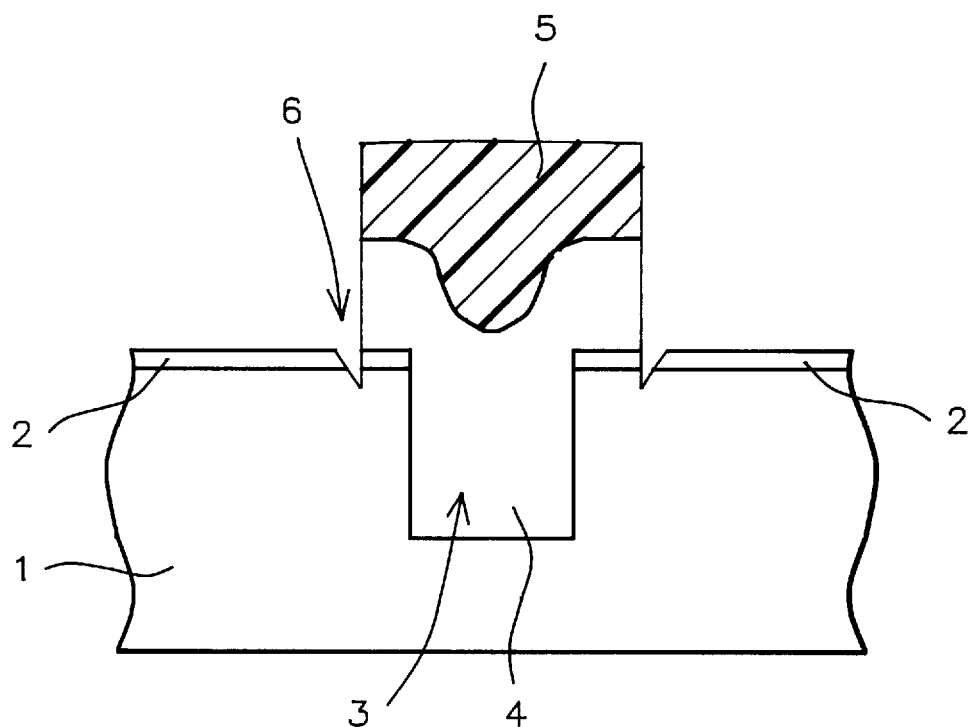
FIG. 2 - Prior Art

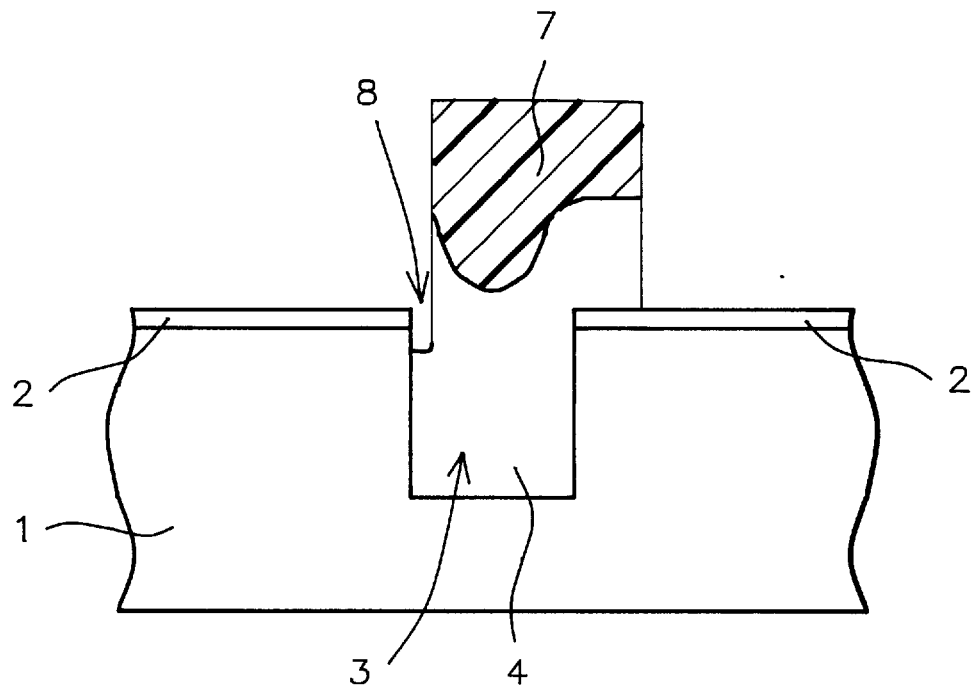
FIG. 3 – Prior Art
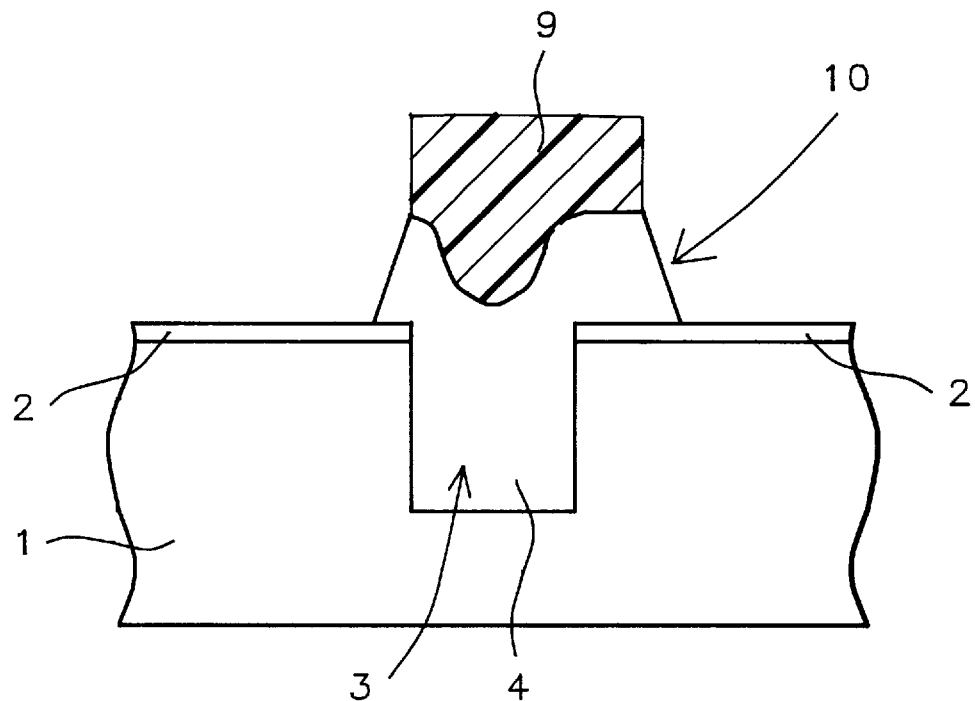
FIG. 4

METHOD FOR FORMING A TAPERED PROFILE INSULATOR SHAPE

BACKGROUND OF THE INVENTION (1) Field of the Invention

The present invention relates to a process used to fabricate semiconductor devices, and more specifically to a dry etching procedure, used to form an insulator shape with a tapered profile.

(2) Description of Prior Art

The semiconductor industry is continually striving to improve device performance, while still attempting to reduce the manufacturing cost of specific metal oxide semiconductor field effect transistor, (MOSFET), devices. The ability to create MOSFET devices with sub-micron features, or micro-miniaturization, has allowed these objectives to be realized. Devices with sub-micron features exhibit less performance degrading resistances and capacitances, thus improving device performance. In addition devices with sub-micron features, allow smaller semiconductor chips to be obtained, still possessing equal, or greater, circuit densities than counterparts, fabricated using larger features. The use of smaller chips allow a greater number of chips to be realized from a specific size starting semiconductor substrate, thus reducing the manufacturing cost of a specific chip.

The realization of semiconductor devices, with sub-micron features, has been mainly attributed to advances in specific semiconductor fabrication disciplines, used in the manufacture of sub-micron MOSFET devices, such as photolithography and dry etching. The use of more advanced exposure cameras, as well as the use of more sensitive photoresist materials, have allowed sub-micron features to be routinely obtained in photoresist layers. In addition the development of advanced dry etching tools and procedures, have allowed the sub-micron images in overlying photoresist layers, to be successfully transferred to underlying materials, used in the manufacture of sub-micron MOSFET devices. However for specific cases, a specific shape or profile, in a material used for the sub-micron MOSFET device, is desired. Therefore for specific applications, specific dry etching procedures are needed for successful fabrication of the sub-micron MOSFET device.

For example in the process used to create insulator filled shallow trenches, a dry etch procedure is initially used to remove excess insulator from regions external to the shallow trench, prior to a final chemical mechanical polishing procedure, used to leave planarized insulator material only in the shallow trench. If the dry etch process is performed without protecting the insulator in the shallow trench, the insulator in the shallow trench may be removed. For this case a photoresist shape is used to mask a region of insulator directly over the insulator filled shallow trench, to protect this region during a dry etching procedure. Two critical aspects of the dry etching procedure are the ability to align the protecting photoresist shape, directly over the shallow trench, and the selectivity of the dry etching procedure, or the ability of the dry etching procedures to stop on the material underlying the insulator layer, in regions external to the shallow trench. This invention will describe a process in which a tapered, or sloped insulator profile, is obtained, thus reducing the critical photoresist alignment requirement. In addition this invention will offer a dry etch chemistry, with selectivity between overlying insulator, silicon oxide in this case, and underlying silicon nitride, allowing complete insulator removal with a minimal attack of underlying silicon nitride. Prior art, such as Hijikata, et al, U.S. Pat. No. 5,254,214, describe a method of plasma taper etching, however that invention does not offer the detailed process needed to create the tapered profile needed in this invention.

SUMMARY OF THE INVENTION

It is an object of this invention to create a tapered profile insulator shape, using a dry etching procedure featuring a high etch rate selectivity between the insulator and an underlying silicon nitride layer It is another object of this invention to use the tapered profile insulator shape as part of the process needed to create an insulator filled shallow trench, for a sub-micron MOSFET device, wherein the formation of the tapered profile insulator shape is formed during the removal of excess insulator from regions outside the shallow trench, via a dry etching procedure.

It is still another object of this invention to remove the tapered profile insulator shape, when used for an insulator filled shallow trench planarization procedure, using a chemical mechanical polishing procedure.

In accordance with the present invention a process for creating a tapered profile insulator shape, used for the process of planarizing insulator filled shallow trenches, has been developed. After creating a shallow trench in a thin silicon nitride layer, and in a semiconductor substrate, an insulator layer of silicon oxide is deposited, completely filling the shallow trench. A photoresist shape is formed directly overlying the insulator filled shallow trench. A dry etch procedure, using a main etching step, followed by an over etch step, is used to completely remove insulator from the underlying silicon nitride layer, without removal or trenching of silicon nitride, in regions unprotected by the photoresist shape, with the resulting insulator shape, underlying the photoresist shaped, exhibiting a tapered profile. Removal of the photoresist shape and a chemical mechanical polishing procedure, results in the planarization of the insulator filled, shallow trench.

BRIEF DESCRIPTION OF THE DRAWINGS

FIGS. 1, 4–5, which schematically, in cross-sectional style, describe the procedure used to create a tapered profile insulator shape, used for the formation and planarization of an insulator filled shallow trench.

FIGS. 2–3, which schematically in cross-sectional style, show prior art, in which the use of straight walled insulator shapes, can result in an non-optimum, insulator filled shallow trench.

DESCRIPTION OF THE PREFERRED EMBODIMENTS

Figure 5:
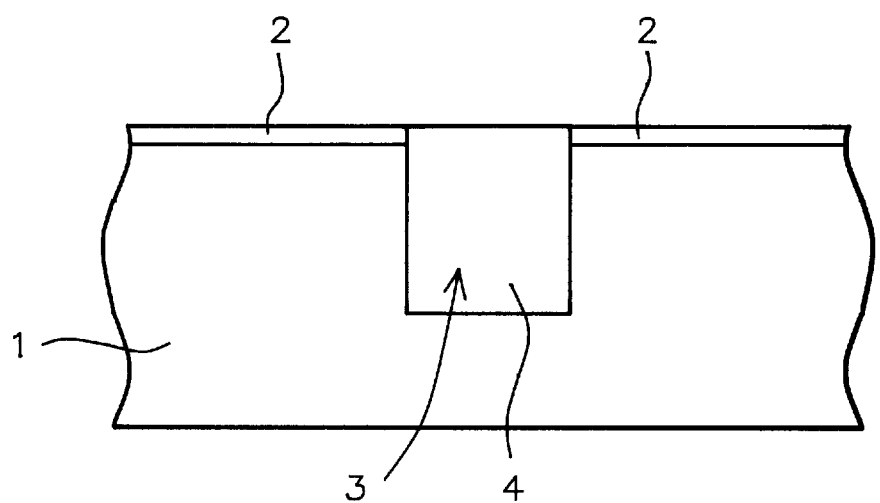

The process of creating a tapered profile insulator shape, using a dry etching procedure featuring high etch rate selectivity between the overlying insulator, and an underlying silicon nitride layer, will now be described in detail. For this invention the process of creating the tapered profile insulator shape, will be applied to the creation of an insulator filled shallow trench. However the use of the tapered profile insulator shape, and the process used to create this shape, can be used for other applications as well.

A P type, semiconductor substrate 1, comprised of single crystalline silicon, with a <100> crystallographic orientation, is used, and shown schematically in FIG. 1. A silicon nitride layer 2, is deposited on semiconductor substrate 1, using either low pressure chemical vapor deposition, (LPCVD), or plasma enhanced chemical vapor deposition, (PECVD), procedures, to a thickness between about 1000 to 2000 Angstroms. A shallow trench 3, is formed in semiconductor substrate 1, using conventional photolithographic and dry etch procedures, using $CHF_3$—$CF_4$—Ar—$O_2$ as an etchant for silicon nitride layer 2, and HBr—$Cl_2$ as an etchant for semiconductor substrate 1. After removal of the photoresist shape used for patterning of shallow trench 3, a silicon oxide layer 4, is deposited, using either LPCVD or PECVD procedures, to a thickness between about 5000 to 7000 Angstroms, completely filling shallow trench 3. This is schematically shown in FIG. 1.

To form an insulator filled shallow trench, with a planar plug of silicon oxide in shallow trench 3, regions of silicon oxide layer 4, on the top surface of silicon nitride layer 2, have to be removed. If only dry etching procedures are used to remove unwanted regions of silicon oxide layer 4, the depression in silicon oxide layer, overlying the shallow trench, will be transferred to the silicon oxide plug in the shallow trench, resulting in a non-planar silicon oxide plug. If only chemical mechanical polishing, (CMP), procedures are used to remove unwanted regions of silicon oxide layer 4, uneven silicon oxide removal rates would exist in regions directly overlying a shallow trench, versus regions between shallow trenches. Therefore a hybrid procedure is used, comprised of initially removing silicon oxide between shallow trenches, via dry etching procedures, followed by a CMP procedure, used to remove silicon oxide from regions directly overlying the shallow trench. However the initial phase of dry etching silicon oxide, from regions between shallow trenches, can present difficulties. FIG. 2, shows prior art in which photoresist shape 5, is used to protect silicon oxide layer 4, overlying shallow trench 3, during the dry etching procedure. The use of an etch chemistry without sufficient etch rate selectivity between silicon oxide and silicon nitride, can result in a decrease in silicon nitride thickness, or a focusing effect. The focusing effect results in enhanced silicon nitride etching at the edge the silicon oxide shape, resulting in undesirable micro-trench 6, in silicon nitride layer 2. A second unwanted result, arising from a non-optimized dry etching procedure, is shown for prior art in FIG. 3. Mis-alignment of photoresist shape 7, and poor etch rate selectivity between silicon oxide and silicon nitride, allow unwanted mini-trench 8, to be created in the insulator filled shallow trench.

A hybrid procedure, used to create a planar, non-defective, silicon oxide filled shallow trench, using a optimized dry etching, initial phase, creating a tapered profile insulator shape will now be described. FIG. 4, schematically shows photoresist shape 9, formed to mask regions of silicon oxide layer 4, overlying shallow trench 3, from a dry etching procedure, used to remove silicon oxide layer 4, from silicon nitride layer 2, in regions between shallow trenches. A dry etch procedure is performed at a pressure between about 100 to 300 mTorr, using a two cycle etch procedure. The first, or main etch, is performed using a mixture of $CHF_3$, between about 20 to 70 sccm, $CF_4$, between about 5 to 20 sccm, and argon, between about 100 to 200 sccm. This mixture results in the a silicon oxide shape, with a tapered profile 10, between about 70° to 80°. The tapered profile of the resulting silicon oxide shape, allows small mis-alignments to be tolerated, since the bottom dimension of the resulting tapered profile silicon oxide shape, is wider than photoresist shape 9. The selectivity between silicon oxide and silicon nitride, using the main etch is about 3 to 1. Therefore to insure complete removal of silicon oxide, a second etch cycle, or the over etch cycle is performed. This is accomplished using a mixture of $CHF_3$, between about 20 to 70 sccm, $CH_3F$, between about 3 to 10 sccm, $CH_2F_2$, between about 0 to 20 sccm, and argon, between about 100 to 200 sccm. The high etch rate selectivity, between about 10 to 1, between silicon oxide layer 4, and underlying silicon nitride layer 2, allows complete removal of silicon oxide layer 4, without micro-trenching, or loss of silicon nitride layer 2. This is schematically shown in FIG. 4.

After removal of photoresist shape 9, via oxygen plasma ashing and careful wet cleans, the second phase of the planarization procedure is performed. A CMP procedure is used to remove regions of silicon oxide layer 4, extending above the top surface of silicon nitride layer 2. The CMP procedure uses silicon nitride layer 2, as a stop layer, resulting in the planar silicon oxide plug 4, in shallow trench 3, schematically shown in FIG. 5.

While this invention has been particularly shown and described with reference to, the preferred embodiments thereof, it will be understood by those skilled in the art that various changes in form and details may be made without departing from the spirit and scope of the invention.

What is claimed is:

1. A method of fabricating an insulator shape, with a tapered profile, on an underlying silicon nitride layer, comprising the steps of:

depositing a silicon nitride layer on a semiconductor substrate;

depositing an insulator layer on said silicon nitride layer;

forming a photoresist shape on said insulator layer;

patterning of said insulator layer via a first phase dry etching procedure, using a mixture of argon —$CHF_3$—$CF_4$, to create said insulator shape, with a tapered profile, on said silicon nitride layer;

performing a second phase dry etching procedure, using a mixture of argon —$CH_3F$—$CHF_3$—$CH_2F_2$, to insure complete removal of said insulator layer, from said silicon nitride layer; and removing said photoresist shape.

2. The method of claim 1, wherein said silicon nitride layer is obtained via LPCVD or PECVD procedures, at a thickness between about 1000 to 2000 Angstroms.

3. The method of claim 1, wherein said insulator layer is silicon oxide, deposited using LPCVD or PECVD procedures, to a thickness between about 5000 to 7000 Angstroms.

4. The method of claim 1, wherein said first phase dry etching procedure is performed at a pressure between about 100 to 300 mTorr.

5. The method of claim 1, wherein said first phase dry etching procedure is performed using between about 100 to 200 sccm of argon, between about 20 to 70 sccm of $CHF_3$, and between about 5 to 20 sccm of $CF_4$, as etchants.

6. The method of claim 1, wherein the profile of said insulator shape is between about 70° to 80°, after said first phase dry etching procedure.

7. The method of claim 1, wherein the etch rate selectivity between said insulator layer and said silicon nitride layer, during said first phase dry etching procedure, is between about 3 to 1.

8. The method of claim 1, wherein said second phase dry etching procedure is performed using between about 100 to 200 sccm of argon, between about 20 to 70 sccm of $CHF_3$, between about 3 to 10 sccm of $CH_3F$, and between about 0 to 20 sccm of $CH_2F_2$, as etchants.

9. The method of claim 1, wherein the etch rate selectivity between said insulator layer and said silicon nitride layer, during said second phase dry etching procedure, is between about 10 to 1.

10. A method of creating an insulator filled shallow trench, in a semiconductor substrate, using a tapered profile insulator shape for planarization of the insulator filled shallow trench, comprising the steps of:

depositing a silicon nitride layer on said semiconductor substrate;

forming a shallow trench in said silicon nitride layer and in said semiconductor substrate;

depositing an insulator layer, on said silicon nitride layer, and completely filling said shallow trench;

forming a photoresist shape, directly over insulator filled shallow trench;

performing a first phase dry etching procedure, removing said insulator layer from said silicon nitride layer, in regions not covered by said photoresist shape, resulting in the formation of said tapered profile insulator shape, underlying said photoresist shape;

performing a second phase dry etching procedure, with a high etch rate ratio between said insulator layer and said silicon nitride layer, to insure complete removal of said insulator layer from said silicon nitride layer, in regions not covered by said photoresist shape;

removing said photoresist shape; and performing a chemical mechanical polishing procedure to remove top portion of said tapered profile insulator shape, resulting in a planar topography for said insulator filled shallow trench.

11. The method of claim 10, wherein said silicon nitride layer is deposited using LPCVD or PECVD procedures, to a thickness between about 1000 to 2000 Angstroms.

12. The method of claim 10, wherein said insulator layer is silicon oxide, deposited using LPCVD or PECVD procedures, to a thickness between about 5000 to 7000 Angstroms.

13. The method of claim 10, wherein said tapered profile insulator shape is formed during said first phase dry etching procedure at a pressure between about 100 to 300 mTorr.

14. The method of claim 10, wherein said tapered profile insulator shape is formed during said first phase dry etching procedure using between about 100 to 200 sccm of argon, between about 20 to 70 sccm of $CHF_3$, and between about 5 to 20 sccm of $CF_4$, as etchants.

15. The method of claim 10, wherein the profile of said tapered profile insulator shape is between about 70° to 80°.

16. The method of claim 10, wherein the etch rate selectivity between said insulator layer, and said silicon nitride layer, during said first phase dry etching procedure, is between about 3 to 1.

17. The method of claim 10, wherein said second phase dry etching procedure is performed using between about 100 to 200 sccm of argon, between about 20 to 70 sccm of $CHF_3$, between about 3 to 10 sccm of $CH_3F$, and between about 0 to 20 sccm of $CH_2F_2$, as etchants.

18. The method of claim 10, wherein the etch rate selectivity between said insulator layer, and said silicon nitride layer, during said second phase dry etching procedure, is between about 10 to 1.

* * * * *